United States Patent
Nogami (10) Patent No.: US 10,578,971 B2
(45) Date of Patent: Mar. 3, 2020

(54) EXPOSURE APPARATUS AND EXPOSURE METHOD

(71) Applicant: Dexerials Corporation, Shinagawa-ku, Tokyo (JP)

(72) Inventor: Asahiko Nogami, Sendai (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 0 days.

(21) Appl. No.: 16/071,984

(22) PCT Filed: Dec. 28, 2016

(86) PCT No.: PCT/JP2016/089182
§ 371 (c)(1),
(2) Date: Jul. 23, 2018

(87) PCT Pub. No.: WO2017/130634
PCT Pub. Date: Aug. 3, 2017

(65) Prior Publication Data
US 2019/0033721 A1   Jan. 31, 2019

(30) Foreign Application Priority Data
Jan. 25, 2016  (JP) .................................. 2016-011719

(51) Int. Cl.
*H01L 21/027* (2006.01)
*G03F 7/20* (2006.01)
(Continued)

(52) U.S. Cl.
CPC .......... *G03F 7/2053* (2013.01); *G03F 7/0002* (2013.01); *G03F 7/70025* (2013.01);
(Continued)

(58) Field of Classification Search
CPC ............. G03F 7/72053; G03F 7/70002; G03F 7/70025; H01L 21/027
(Continued)

(56) References Cited

U.S. PATENT DOCUMENTS

2010/0226218 A1* 9/2010 Nakamura ............. G11B 7/005
369/47.5
2010/0232264 A1* 9/2010 Narumi ................ G11B 7/0908
369/44.14

FOREIGN PATENT DOCUMENTS

CN          1484099 A       3/2004
CN        101501767 A       8/2009
(Continued)

OTHER PUBLICATIONS

Apr. 11, 2017, International Search Report issued in the International Patent Application No. PCT/JP2016/089182.
(Continued)

*Primary Examiner* — Hung Nguyen
(74) *Attorney, Agent, or Firm* — Kenja IP Law PC (57) ABSTRACT

An exposure apparatus 10 is an exposure apparatus for forming a pattern by exposure by irradiating a set master 1 with laser light, comprising: an optical pickup 12 which is capable of adjusting the focus of laser light and a control unit 19 which adjusts the focus of laser light emitted from the optical pickup 12 using integrated surface profile data indicating the relative positional relationship between the surface of the master 1 and the optical pickup 12 according to at least one of the surface roughness of the master 1, the inclination of the master 1, and the decentering of the master 1.

17 Claims, 6 Drawing Sheets

(51) Int. Cl.
*G03F 7/00* (2006.01)
*H01S 3/106* (2006.01)
*H01S 3/13* (2006.01)

(52) U.S. Cl.
CPC ............ *H01L 21/027* (2013.01); *H01S 3/106* (2013.01); *H01S 3/1305* (2013.01)

(58) Field of Classification Search
USPC .................................................... 355/53, 67
See application file for complete search history.

(56) References Cited

FOREIGN PATENT DOCUMENTS

| | | |
|---|---|---|
| JP | 10773490 A | 3/1995 |
| JP | 2005175334 A | 6/2005 |
| JP | 2006269802 A | 10/2006 |
| JP | 2010117507 A | 5/2010 |
| JP | 2010146698 A | 7/2010 |
| JP | 2011170938 A | 9/2011 |
| JP | 2015005678 A | 1/2015 |

OTHER PUBLICATIONS

Oct. 29, 2019, Notification of Reasons for Refusal issued by the Japan Patent Office in the corresponding Japanese Patent Application No. 2016-011719.
Jan. 2, 2020, Office Action issued by the China National Intellectual Property Adminstration in the corresponding Chinese Patent Application No. 201680079446.5.

* cited by examiner

EXPOSURE APPARATUS AND EXPOSURE METHOD

CROSS-REFERENCE TO RELATED APPLICATIONS

This application claims priority to Japanese Patent Application No. 2016-011719 filed on Jan. 25, 2016, the entire disclosure of which is incorporated herein by reference.

TECHNICAL FIELD

This disclosure relates to an exposure apparatus and an exposure method by which a master is irradiated with laser light to form a pattern by exposure.

BACKGROUND

One of micro-fabrication techniques is a nanoimprint technique in which a plate-like or a cylindrical (columnar) master on which surface a fine pattern is formed is pressed against a resin sheet for example to transfer the fine pattern on the master to the resin sheet for example.

JP 2015-005678 A (PTL 1) discloses an exposure apparatus for forming a fine pattern on a surface of a master. This exposure apparatus includes spindles provided at both ends of a cylindrical master to hold the master between them, and a light source emitting a laser beam (laser light). While the master of which surface is coated with thermo-reactive resist or photoreactive resist is rotated, the master is irradiated with (subjected to) a laser beam emitted from the light source in a pattern corresponding to a desired pattern, so that the thermo-reactive resist or photoreactive resist is reacted to form the desired pattern on the surface of the master. Further, the exposure apparatus receives the laser beam reflected by the master with a four-quadrant detector having an active area with four separate receiving areas and controls the focal position of the laser beam depending on the received light.

CITATION LIST

Patent Literature

PTL 1: JP 2015-005678 A

SUMMARY

Technical Problem

Figure 5:
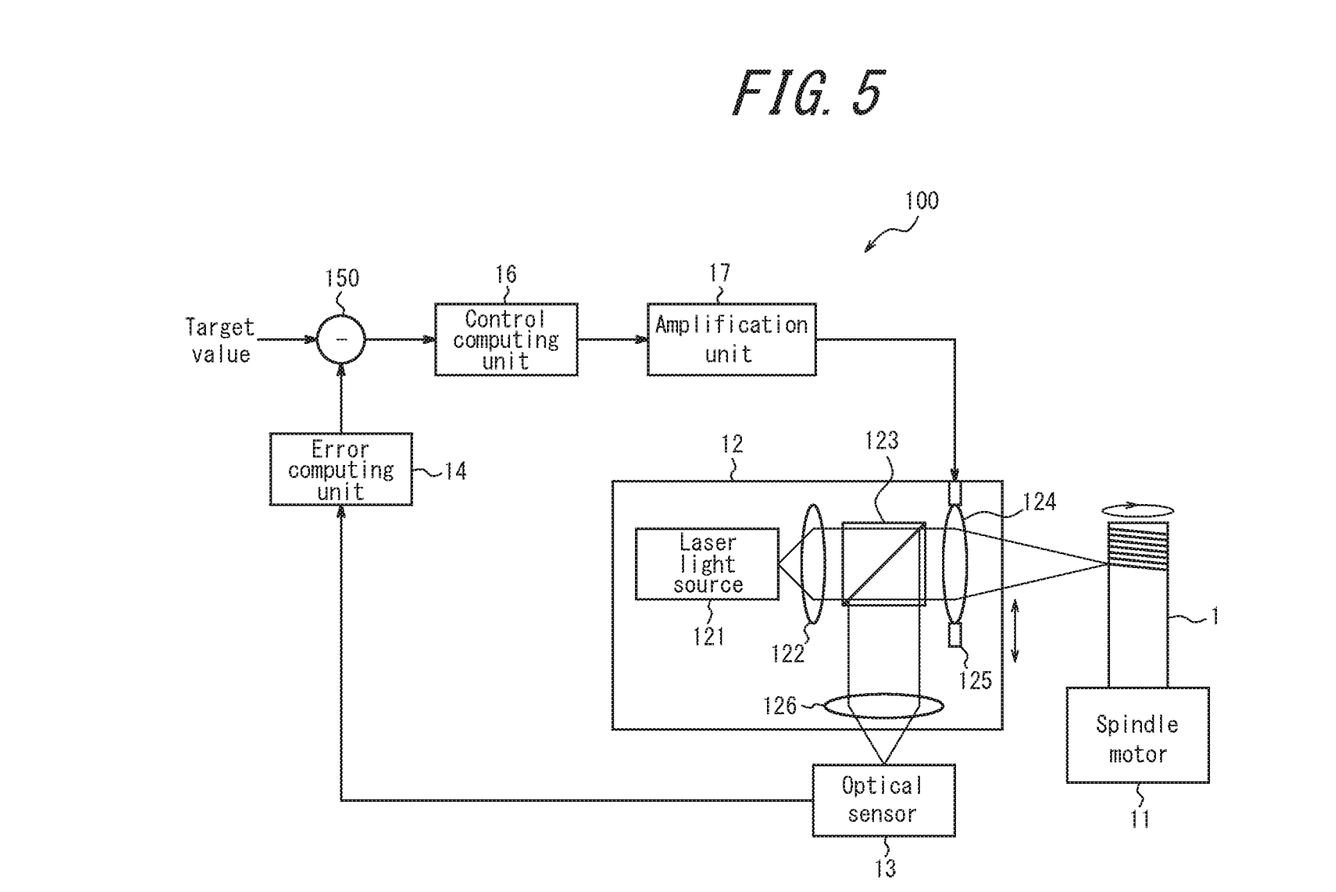
FIG. 5 is a diagram illustrating an example configuration of an exposure apparatus performing focus control.

FIG. 5 is a diagram illustrating an example configuration of an exposure apparatus performing focus control.

The exposure apparatus 100 depicted in FIG. 5 includes a spindle motor 11, an optical pickup 12, an optical sensor 13, an error computing unit 14, a subtracter 150, a control computing unit 16, and an amplification unit 17.

A cylindrical (or columnar) master 1 is set on the spindle motor 11, which rotates the set master 1 in the circumferential direction.

The optical pickup 12 emits laser light toward the master 1 set on the spindle motor 11. The optical pickup 12 is provided to be slidable in the direction of the axis of the master 1. The surface of the master 1 can be irradiated with laser light emitted from the optical pickup 12 by sliding the optical pickup 12 in the direction of the axis of the master 1 while rotating the master 1 using the spindle motor 11. Thermo-reactive resist or photoreactive resist is formed on the surface of the master 1 by coating, and the master 1 is irradiated with laser light to react a part of the thermo-reactive resist or photoreactive resist that is irradiated with the laser light, thereby forming a pattern on a given area of the surface of the master by exposure.

The optical pickup 12 includes a laser light source 121, a collimator lens 122, a polarizing beam splitter 123, an object lens 124, an actuator 125, and a cylindrical lens 126.

The laser light source 121 outputs laser light. The collimator lens 122 makes laser light output from the laser light source 121 into parallel light and outputs the light to the polarizing beam splitter 123.

The polarizing beam splitter 123 passes laser light output from the collimator lens 122 and allows the light to transmit to the object lens 124. The laser light emitted by the optical pickup 12 is reflected by the master 1, and the polarizing beam splitter 123 reflects the light incident through the object lens 124 to direct the light to the cylindrical lens 126.

The object lens 124 concentrates laser light transmitted through the polarizing beam splitter 123 and directs the light toward the master 1. The actuator 125 displaces the object lens 124 in the direction toward the master 1 (forward and backward). When the object lens 124 is displaced, the focus position of laser light to be emitted changes. Thus, the optical pickup 12 can adjust the focus of laser light.

The cylindrical lens 126 concentrates light reflected by the polarizing beam splitter 123 (reflected light from the master 1) on an active area of the optical sensor 13.

Figure 6:
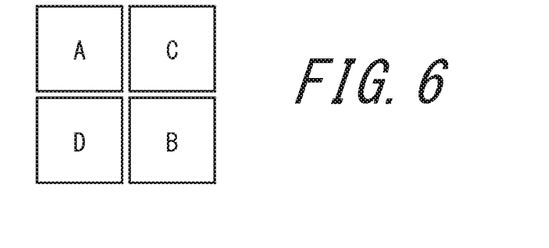
FIG. 6 is a diagram illustrating an example of an active area of the optical sensor depicted in FIG. 5.

The optical sensor 13 is a sensor which receives light from the cylindrical lens 126 (reflected light from the master 1) on the active area and performs output depending on the received light, and is for example a four-quadrant photodiode (PD). In this case, the optical sensor 13 has an active area divided into four areas (areas A, B, C, and D) as illustrated in FIG. 6.

Figure 7A:
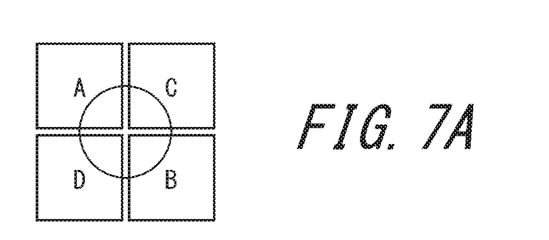
FIG. 7A is a diagram illustrating a state where an active area of the optical sensor depicted in FIG. 5 receives light.
Figure 7B:
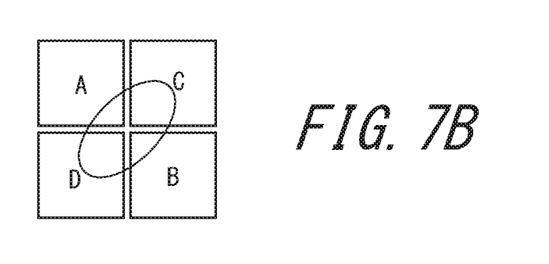
FIG. 7B is a diagram illustrating a state where the active area of the optical sensor depicted in FIG. 5 receives light.
Figure 7C:
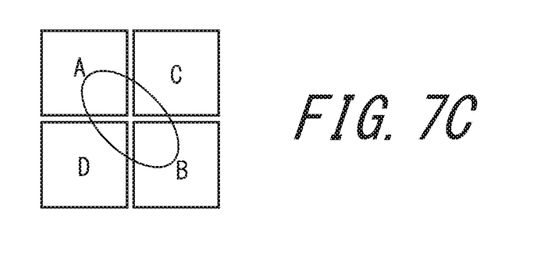
FIG. 7C is a diagram illustrating a state where the active area of the optical sensor depicted in FIG. 5 receives light.

When laser light illuminating the master 1 focuses on the surface of the master 1, light received by the active area of the optical sensor 13 forms a perfect circle as illustrated in FIG. 7A and is roughly even between the areas A to D. On the other hand, when laser light illuminating the master 1 does not focus on the surface of the master 1 (focus error of laser light occurs), light received by the active area of the optical sensor 13 forms an elliptical shape at an angle as illustrated in FIGS. 7B and 7C. The optical sensor 13 outputs voltages $V_A$ to $V_D$ corresponding to the light illuminating the respective areas A to D to the error computing unit 14.

The error computing unit 14 performs output corresponding to the focus error of the laser light illuminating the master 1. Specifically, the error computing unit 14 calculates a voltage corresponding to the focus error of the laser light illuminating the master 1 (focus error voltage) based on the following formula (1), and outputs the calculated focus error voltage to the subtracter 150.

$$\text{Focus error voltage} = (V_A + V_B) - (V_C + V_D) \qquad (1)$$

As described above, when laser light illuminating the master 1 focuses on the surface of the master 1, light received by the active area of the optical sensor 13 forms a perfect circle and evenly illuminates the four areas. Accordingly, the focus error voltage calculated using formula (1) is nearly zero. On the other hand, when laser light illuminating the master 1 does not focus on the surface of the master 1, light received by the active area of the optical sensor 13 forms an elliptical shape at an angle. Accordingly, the focus error voltage calculated using formula (1) is not zeroed out. Thus, a focus error voltage corresponding to the focus error of laser light illuminating the master 1 is output by the error computing unit 14.

The subtracter 150 calculates the difference between a target value and the output from the error computing unit 14 (focus error voltage) and outputs the calculated difference to the control computing unit 16. The target value is, for example, a value corresponding to the voltage output from the error computing unit 14 with the laser light illuminating the master 1 focusing on the surface of the master 1.

The control computing unit 16 generates a control signal for the actuator 125 for moving the object lens 124 so as to zero out the difference calculated by the subtracter 150 and outputs the signal to the amplification unit 17. The control computing unit 16 generates a control signal for example according to a proportional-integral-differential controller (PID controller).

The amplification unit 17 amplifies the control signal output from the control computing unit 16 and outputs the signal to the actuator 125. The actuator 125 is then controlled so that the difference calculated by the subtracter 150 is zeroed out. Thus, the exposure apparatus 100 has an autofocus function for adjusting the focus position of laser light to suppress a focus error.

However, even in the exposure apparatus 100 depicted in FIG. 5, a focus error cannot completely be removed, and an error (residual error) of approximately one out of a loop transfer function (gain) for the whole loop from the subtracter 150 to the error computing unit 14 (focus servo loop) would remain.

When a pattern is formed on a set master by exposure, if the relative positional relationship between the optical pickup 12 and the surface of the master 1 is significantly varied by the influence of the roughness (irregularities) of the surface of the master, the inclination or the decentering of the master, etc., the residual error would be large. A large residual error makes it impossible to form a pattern on the master by exposure with high accuracy.

Conventionally, in order to prevent reduction in the exposure accuracy due to a residual error described above, there have been attempts to increase the polishing accuracy of the surface of a master. However, increasing the polishing accuracy requires time and effort, leading to increased cost.

It could be helpful to address the above problems and provide an exposure apparatus and an exposure method by which a pattern can be more accurately formed on a master by exposure without significant increase in cost.

Solution to Problem

In view of solving the above problems, an exposure apparatus of this disclosure is an exposure apparatus for forming a pattern by exposure by irradiating a set master with laser light, comprising: a light source unit emitting the laser light and capable of adjusting a focus of the laser light; and a control unit adjusting a focus of laser light emitted from the light source unit using integrated surface profile data indicating a relative positional relationship between a surface of the master and the light source unit depending on at least one of surface roughness of the master, inclination of the master, and decentering of the master.

Further, in view of solving the above problems, in the exposure apparatus of this disclosure, the control unit preferably comprises: an error detection unit performing output corresponding to a focus error of the laser light; an adder adding a target value corresponding to an output from the error detection unit with the laser light focusing on the surface of the master and an offset value based on a correction signal generated based on the integrated surface profile data; and a control computing unit adjusting a focus of the laser light based on a difference between a sum obtained by the adder and the output from the error detection unit.

Further, in view of solving the above problems, in the exposure apparatus of this disclosure, the correction signal is preferably one of a table and a function corresponding to the position of the surface of the master.

Further, in view of solving the above problems, in the exposure apparatus of this disclosure, the control unit preferably comprises: an error detection unit performing output corresponding to a focus error of the laser light; a computing unit calculating an offset value for correcting the target value corresponding to the output from the error detection unit with the laser light focusing on the surface of the master by performing predetermined computations on the output from the error detection unit based on the integrated surface profile data; an adder adding the target value and the offset value calculated by the computing unit; and a control computing unit adjusting a focus of the laser light based on a difference between a sum obtained by the adder and the output from the error detection unit.

Preferably, in view of solving the above problems, in the exposure apparatus of this disclosure, the light source unit is an optical pickup, and the integrated surface profile data are measured by the optical pickup.

Preferably, in view of solving the above problems, in the exposure apparatus of this disclosure, the optical pickup includes an optical sensor outputting a voltage corresponding to a focus error of the laser light, and the integrated surface profile data are measured based on the output from the optical sensor.

Preferably, in view of solving the above problems, in the exposure apparatus of this disclosure, the optical pickup comprises: an object lens directing the laser light to the master; and an actuator displacing the object lens, and the integrated surface profile data are measured based on a current flowing in the actuator.

Further, in view of solving the above problems, in the exposure apparatus of this disclosure, the integrated surface profile data are preferably measured by a displacement meter.

Further, in view of solving the above problems, in the exposure apparatus of this disclosure, the master is preferably one of a cylindrical master and a columnar master.

Further, in view of solving the above problems, in the exposure apparatus of this disclosure, the master is preferably a plate-like master.

Preferably, in view of solving the above problems, an exposure method of this disclosure is an exposure method using an exposure apparatus which includes a light source emitting laser light and is capable of adjusting a focus of laser light, and emits the laser light to a set master; wherein a focus of laser light emitted from the light source unit is adjusted using integrated surface profile data indicating a relative positional relationship between a surface of the master and the light source unit depending on at least one of surface roughness of the master, inclination of the master, and decentering of the master.

Advantageous Effect

According to an exposure apparatus and an exposure method of this disclosure, a pattern can be more accurately formed on a master by exposure without significant increase in cost.

DETAILED DESCRIPTION

Embodiments of this disclosure will be described below.
(First Embodiment)

Figure 1:
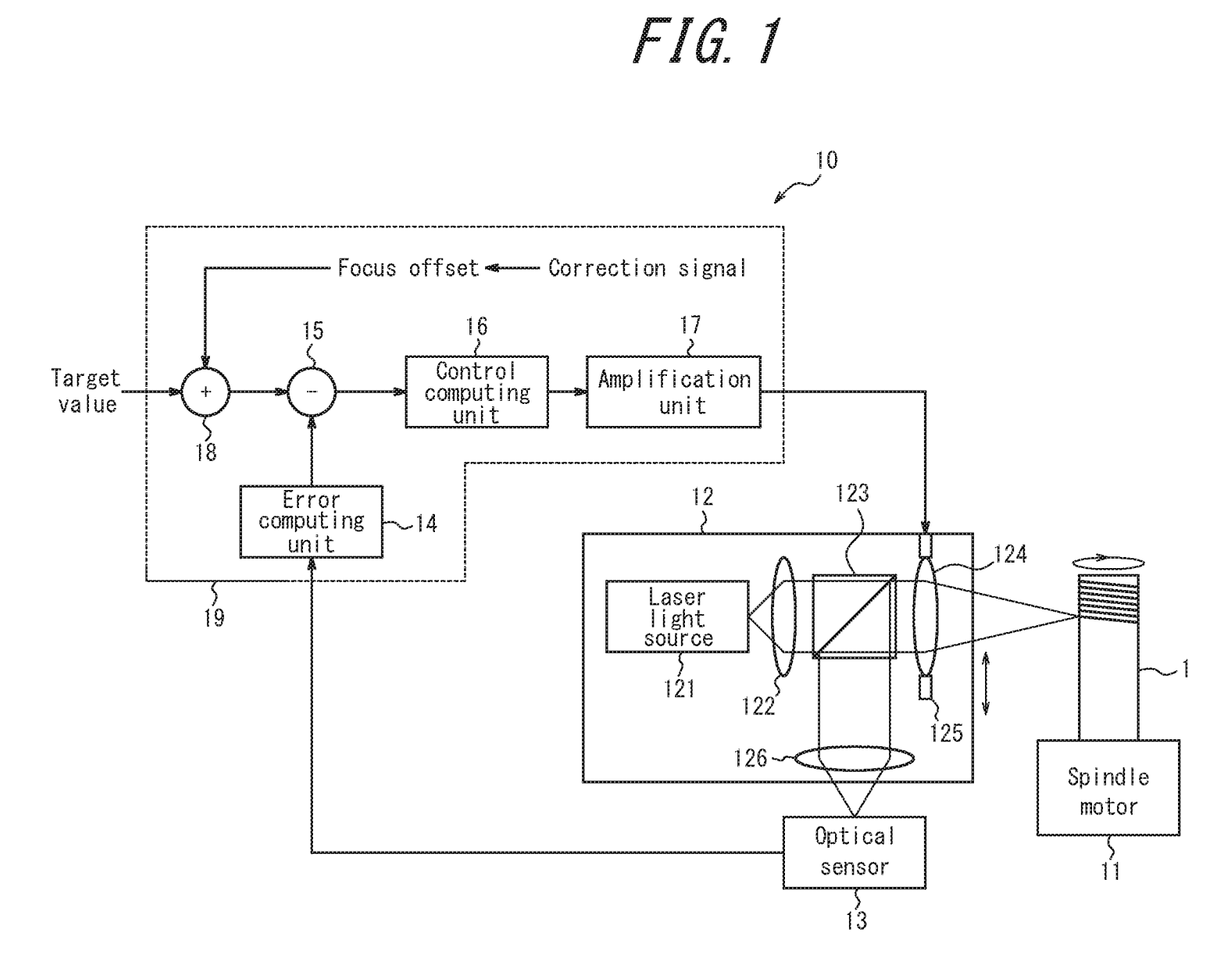
FIG. 1 is a diagram illustrating an example configuration of an exposure apparatus according to a first embodiment of this disclosure.

FIG. 1 is a diagram illustrating an example configuration of an exposure apparatus 10 according to a first embodiment of this disclosure; The same reference numerals designate like components of the exposure apparatus in FIG. 1 and the exposure apparatus 100 in FIG. 5, and a description of those components will not be repeated.

The exposure apparatus 10 depicted in FIG. 1 is different from the apparatus 100 depicted in FIG. 5 in that an adder 18 is added and the subtracter 150 is replaced with a subtracter 15. Accordingly, the exposure apparatus 10 includes a spindle motor 11, an optical pickup 12 (light source unit), an optical sensor 13, an error computing unit 14 (error detection unit), the subtracter 15, a control computing unit 16, an amplification unit 17, and the adder 18. The error computing unit 14, the subtracter 15, the control computing unit 16, the amplification unit 17, and the adder 18 constitute a control unit 19. The optical pickup 12 and the optical sensor 13 are separate in FIG. 1; however, the optical sensor 13 may be incorporated in the optical pickup 12.

The control unit 19 acquires integrated surface profile data which are measurement results of the relative positional relationship between the optical pickup 12 and the surface of the master 1, corresponding to at least one of the roughness (irregularities) of the surface of the master 1 set on the spindle motor 11, and the inclination and decentering of the master 1. The control unit 19 generates a correction signal for correcting a target value so that a focus error left at each position on the surface of the master 1 after the focus servo loop from the subtracter 15 to the error computing unit 14 is zeroed out based on the acquired integrated surface profile data, and stores the signal in a storage unit etc. not shown in FIG. 1. The correction signal is expressed for example by a table or a function.

Further, a focus offset (offset value) to be added to the target value is input to the adder 18 according to the correction signal depending on the position on the surface of the master 1 to be exposed to light.

The adder 18 adds the target value and the focus offset based on the correction signal, and outputs the sum to the subtracter 15.

The subtracter 15 calculates the difference between the value output from the adder 18 and a focus error voltage output by the error computing unit 14, and outputs the calculation result to the control computing unit 16. Subsequently, as with the exposure apparatus 100 depicted in FIG. 5, the actuator 125 is controlled so that the difference calculated by the subtracter 15 is zeroed out. As described above, in the exposure apparatus 100 depicted in FIG. 5, although the control was performed so that the difference between the target value and the focus error voltage is zeroed out, a focus error of approximately one out of a loop transfer function (focus servo transfer function) of the focus servo loop would be left. On the other hand, in the exposure apparatus 10 of this embodiment, focus control is performed after adding a focus offset for correcting the target value so that a focus error left after the focus servo loop is zeroed out, to the target value based on the acquired integrated surface profile data, so that a focus error can be suppressed with higher accuracy, and as a result, a pattern can be formed on the master 1 by exposure with higher accuracy.

Next, a method of generating the correction signal will be described.

After setting the master 1, an autofocus function is enabled (focus servo loop is enabled), the rotation speed of the spindle motor 11 is set to a predetermined value and the sliding rate of the optical pickup 12 is set to a predetermined value.

Next, laser light is emitted by the optical pickup 12 to a degree where thermo-reactive resist or photoreactive resist applied to the surface of the master 1 does not react (at a dose and for an irradiation time such that the thermo-reactive resist or photoreactive resist does not react) to thereby scan the entire or a part of the surface of the master 1. Further, a focus error voltage output by the error computing unit 14 is measured at a predetermined sampling rate. As described above, a focus error can be suppressed by feedback control performed by the focus servo loop; however, the focus error cannot be completely removed and an error of approximately one out of the focus servo transfer function remains. The error is output as the focus error voltage from the error computing unit 14. Here, since the focus servo transfer function is well known, integrated surface profile data representing the relative relationship between the surface of the master 1 and the optical pickup 12 can be acquired by the focus error voltage output by the error computing unit 14.

Next, a correction signal (table or function) for adjusting the focus offset so that the focus error voltage is zeroed out is generated by calculations based on the measured focus error voltage and the focus servo transfer function.

Note that the method of generating the correction signal is not limited to the above method using a focus error voltage; alternatively, a correction signal can be generated for example using a current (VCM current) flowing in the actuator 125. Hereinafter a method of generating a correction signal using a VCM current will be described.

After setting the master 1, an autofocus function is enabled (focus servo loop is enabled), the rotation speed of the spindle motor 11 is set to a predetermined value and the sliding rate of the optical pickup 12 is set to a predetermined value.

Next, laser light is emitted by the optical pickup 12 to a degree where thermo-reactive resist or photoreactive resist applied to the surface of the master 1 does not react to thereby scan the entire or a part of the surface of the master 1. Further, the VCM current is measured at a predetermined sampling rate. As described above, the actuator 125 is operated so as to suppress a focus error using the autofocus function. Accordingly, a VCM current indicates the displacement of the object lens 124, that is, the relative positional relationship between the surface of the master 1 and the optical pickup 12, and the integrated surface profile data can be acquired by measuring the VCM current.

Next, a correction signal for adjusting the focus offset so that the focus error voltage is zeroed out is generated by calculations based on the measured VCM current and the known focus servo transfer function.

When the focus error voltage is low and the quantization error is large, if a correction signal is generated based on the focus error voltage, the error would be large. In this case, the displacement of the object lens 124 is calculated from the VCM current; a residual error is estimated from the displacement, the focus servo transfer function, and properties of the optical sensor 13; and a correction signal is generated such that the residual error is compensated. Thus, a highly accurate correction signal can be generated.

Alternatively, the focus error voltage and the VCM current may be measured and a correction signal may be generated from the measurement results.

As described above, the optical sensor 13 may be incorporated in the optical pickup 12, and the focus error voltage and the VCM current may be detected by the optical pickup 12. Accordingly, the focus error voltage and the VCM current is measured using the optical pickup 12 and integrated surface profile data can be acquired by the measurement results.

Alternatively, the integrated surface profile data of the master 1 may be measured using a displacement meter and a correction signal may be generated by the measurement result. In this case, a displacement meter such as a laser displacement sensor, a displacement laser interferometer, or a capacitive displacement sensor is used to measure the integrated surface profile data of the master 1. Subsequently, a correction signal is generated based on the results of the measurement using a displacement meter and the known focus servo transfer function.

Figure 2:
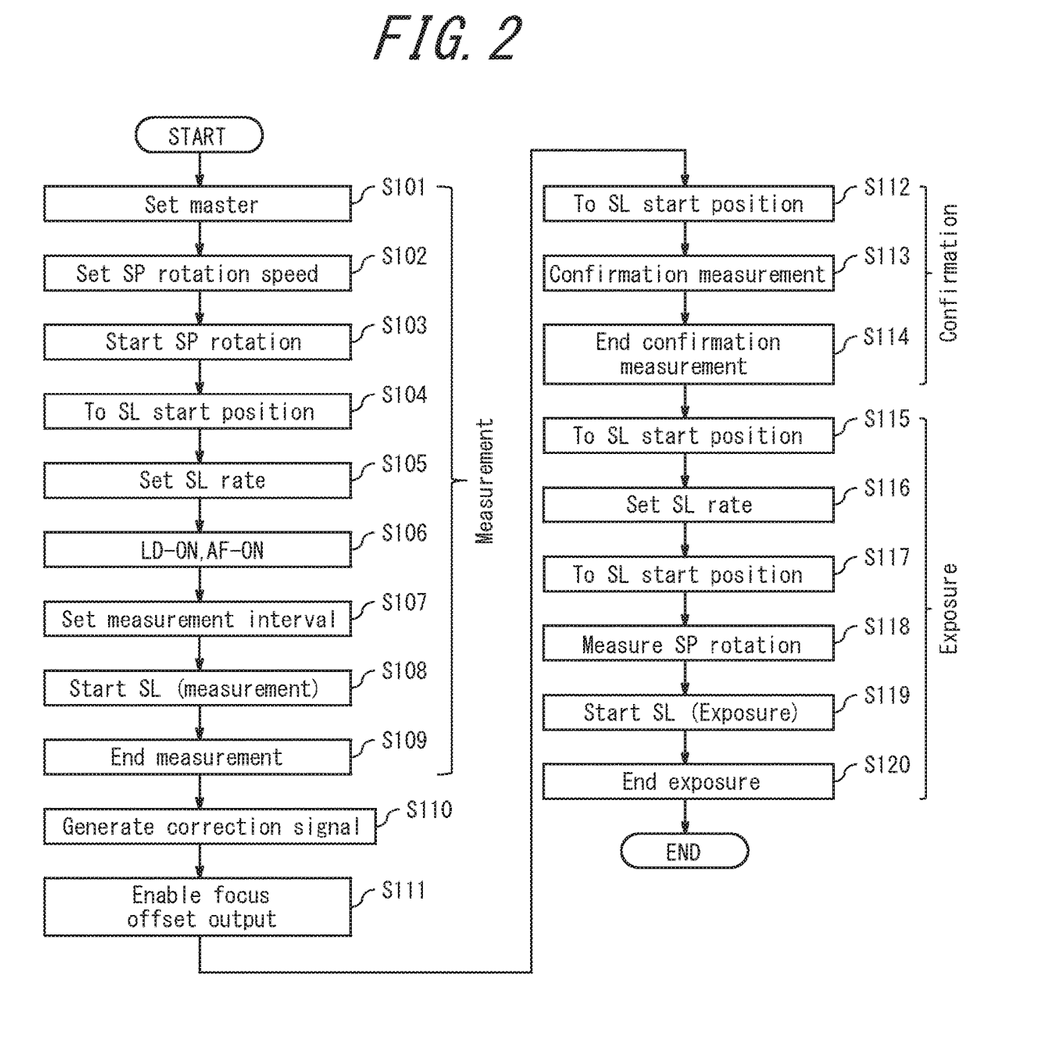
FIG. 2 is a flowchart giving an example of the operation of the exposure apparatus depicted in FIG. 1.

Next, operations of the exposure apparatus 10 of this embodiment will be described with reference to the flowchart given in FIG. 2.

First, the integrated surface profile data are measured. Specifically, a cylindrical (or columnar) master 1 is set on the spindle motor (SP) 11 (Step S101). Next, the rotation speed of the spindle motor 11 (SP rotation speed) is set (Step S102), and the spindle motor 11 is rotated in accordance with the setting (Step S103).

Further, the optical pickup 12 is moved to a starting position from which the optical pickup 12 is slid (SL start position)(Step S104), and the sliding rate (SL rate) of the optical pickup 12 is set (Step S105).

Next, the laser light source (LD) 121 is turned on to output laser light and the focus servo loop is enabled, thereby turning the autofocus function (AF) on (Step S106). Further, a measurement interval for the measurement of the focus error voltage or VCM current is set (Step S107). The sliding of the optical pickup 12 is then started, the focus error voltage or VCM current is measured at the measurement interval set, and measurements of the integrated surface profile data are started (Step S108).

After the completion of scanning of the entire or a part (predetermined area) of the master 1 with laser light, the measurements of the integrated surface profile data are terminated (Step S109). Subsequently, a correction signal is generated based on the measured integrated surface profile data (Step S110). Output of the focus offset based on the generated correction signal to the adder 18 is enabled (Step S111).

Next, the generated correction signal is measured for confirmation. Specifically, the optical pickup 12 is moved to the SL start position (Step S112), the focus error voltage is measured, and a measurement is performed to confirm whether or not the laser light focuses on the surface of the master 1 (Step S113). If the laser light is confirmed to focus on the surface of the master 1, the confirmation measurement is terminated (Step S114). When the laser light does not focus on the surface of the master 1, measurements of integrated surface profile data and generation of a correction signal are performed again. Note that the confirmation measurement from Step S112 to Step S114 may be omitted as appropriate.

Next, exposure of the master 1 with light is started. Specifically, the optical pickup 12 is moved to the SL start position (Step S115), and the SL rate is set (Step S116). Further, the spindle motor 11 is moved to a position where rotation of the spindle starts (SP start position)(Step S117), and the SP rotation speed is set (Step S118). Subsequently, sliding of the optical pickup 12 is started and exposure of the master 1 with light is started (Step S119). During exposure, irradiation with laser light is performed so that the thermoreactive resist or photoreactive resist applied to the surface of the master 1 reacts. After the completion of the exposure of the master 1 with light (Step S120), the exposure apparatus 10 terminates operation.

According to this embodiment as described above, the exposure apparatus 10 includes the optical pickup 12 which is a light source unit which emits laser light and is capable of adjusting the focus of the laser light and the control unit 19 which adjusts the focus of the laser light emitted from the optical pickup 12 using integrated surface profile data indicating the relative positional relationship between the surface of the master 1 and the optical pickup 12 according to at least one of the surface roughness of the master 1, the inclination of the master 1, and the decentering of the master 1.

Using the integrated surface profile data, a focus error left after operating only a focus servo loop can be suppressed, a focus error can be suppressed with higher accuracy, and as a result, a pattern can be formed on the master 1 by light exposure with higher accuracy. Since focus control can be performed with higher accuracy, the polishing accuracy required for the master 1 can be reduced, so that significant increase in cost can be avoided.

(Second Embodiment)

Figure 3:
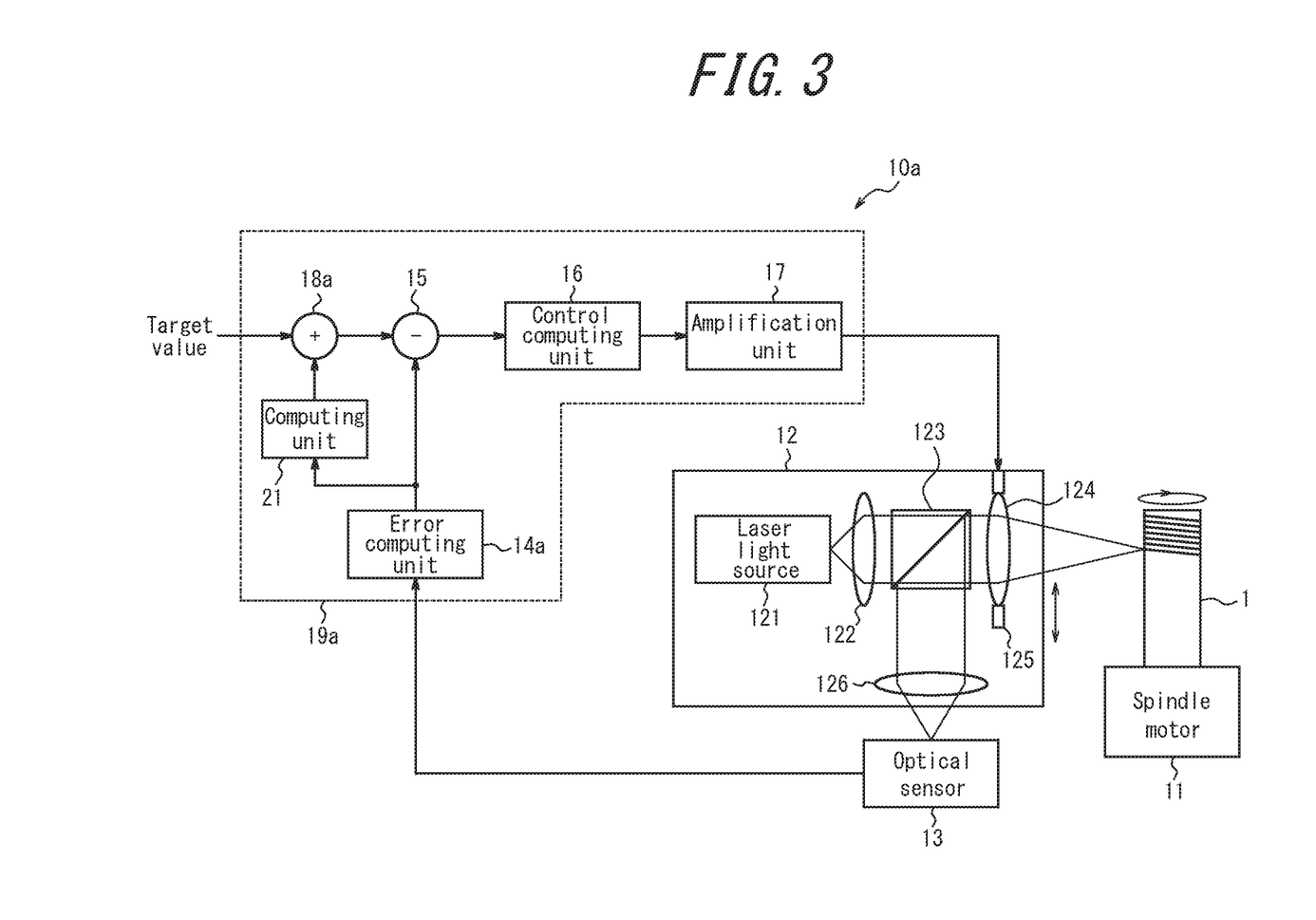
FIG. 3 is a diagram illustrating an example configuration of an exposure apparatus according to a second embodiment of this disclosure.

FIG. 3 is a diagram illustrating an example configuration of an exposure apparatus 10a according to a second embodiment of this disclosure. The same reference numerals designate like components in FIG. 3 and FIG. 1, and a description of those components will not be repeated.

The exposure apparatus 10a depicted in FIG. 3 is different from the exposure apparatus 10 depicted in FIG. 1 in that the control unit 19 is replaced with a control unit 19a.

Compared with the control unit 19, the control unit 19a is different in that the error computing unit 14 is replaced with an error computing unit 14a, the adder 18 is replace with an adder 18a, and a computing unit 21 is added.

The error computing unit 14a outputs a calculated focus error voltage to the subtracter 15 and to the computing unit 21.

The computing unit 21 performs predetermined computations on the focus error voltage output by the error computing unit 14a, calculates a focus offset to be added to a target value, and outputs the focus offset to the adder 18a.

Note that computations performed by the computing unit 21 include filtering of the focus error voltage and a coefficient operation for a multiplication by a predetermined coefficient. The computing unit 21 performs filtering and a coefficient operation mentioned above based on the measured integrated surface profile data. The inclination or decentering of the master 1 set on the spindle motor 11 have some tendencies, and the tendencies can be ascertained by repeating measurements of integrated surface profile data. The computing unit 21 may perform computations based on such tendencies. This makes it unnecessary to measure integrated surface profile data every time the master 1 is set, and allows the master 1 to be exposed with high efficiency.

The adder 18a adds the target value and the focus offset output from the computing unit 21 and outputs the sum to the subtracter 15. Subsequently, as with the exposure apparatus 10 depicted in FIG. 1, the subtracter 15 calculates the difference between the output from the adder 18a and the focus error voltage, and the actuator 125 is controlled so that the difference is zeroed out.

Figure 4:
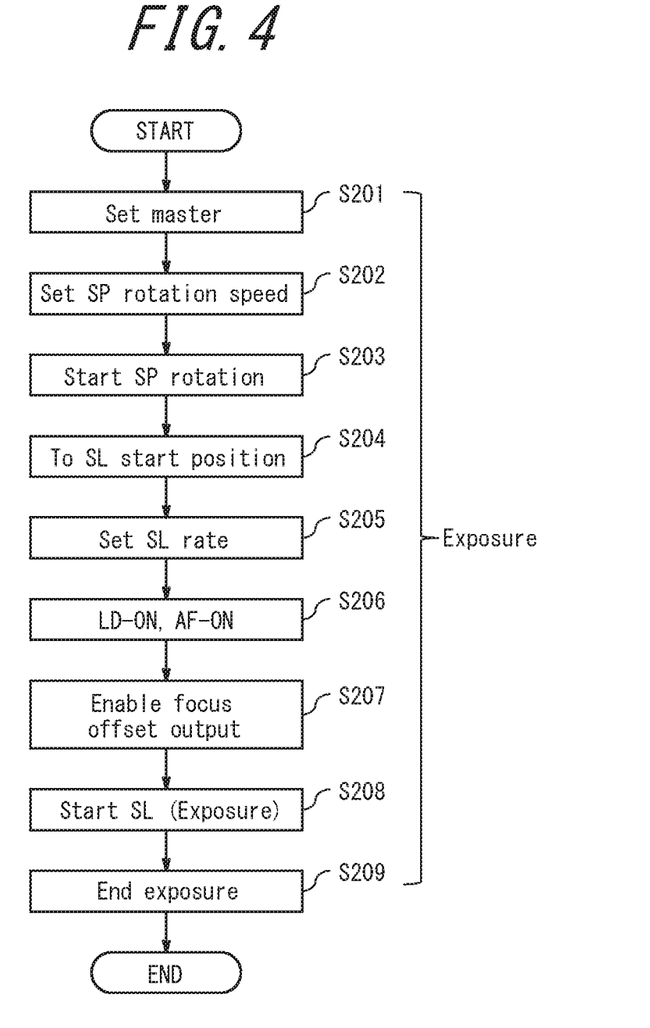
FIG. 4 is a flowchart giving an example of the operation of the exposure apparatus depicted in FIG. 3.

Next, operations of the exposure apparatus 10a of this embodiment will be described with reference to the flowchart given in FIG. 4. Note that in FIG. 4, data for performing predetermined computations based on the measurement results of integrated surface profile data on the focus error voltage output from the error computing unit 14a are input to the computing unit 21. Accordingly, in this embodiment, exposure of the master 1 is started without measuring integrated surface profile data.

First, a cylindrical master 1 is set on the spindle motor 11 (Step S201). Next, the SP rotation speed is set (Step S202), and the spindle motor 11 is rotated in accordance with the setting (Step S203).

Further, the optical pickup 12 is moved to the SL start position (Step S204), and the SL rate is set (Step S205).

Next, the laser light source (LD) 121 is turned on to output laser light and the focus servo loop is enabled, thereby enabling the autofocus function (AF)(Step S206). Further, output of the focus offset from the computing unit 21 is enabled (Step S207), sliding of the optical pickup 12 is started, and exposure of the master 1 is started (Step S208). A focus error voltage is output from the error computing unit 14a depending on the dose of laser light on the master 1, computations on the focus error voltage are performed by the computing unit 21, and a focus offset is output to the adder 18a. Repeating those steps, a focus error left after operating only a focus servo loop can be suppressed, a focus error can be suppressed with higher accuracy, and as a result, a pattern can be formed on the master 1 by light exposure with higher accuracy. Since focus control can be performed with higher accuracy, the polishing accuracy required for the master 1 can be reduced, so that significant increase in cost can be avoided.

Next, the accuracy of the formation of a pattern by the exposure apparatuses 10 and 10a according to the above-described first and second embodiments, and the accuracy of the formation of a pattern using the exposure apparatus 100 depicted in FIG. 5 without the use of integrated surface profile data will be described.

A cylindrical metal member having a diameter of 10 cm and a height of 10 cm was used as the master 1, and its surface profile error was 100 μmp-p. Further, the rotational speed of the spindle motor 11 was set to 2500 rpm, and the sliding rate of the optical pickup 12 was set to 10 μm/s. The laser light source 121 output laser light of a wavelength of 405 nm, and a pattern was formed by light exposure on the master 1 using each of the exposure apparatuses 10 and 10a according to the first and second embodiments and the exposure apparatus 100 depicted in FIG. 5 with the low frequency loop gain of the focus servo loop being set to 60 dB (1,000 times).

As a result of forming each pattern on the master 1 by light exposure, the pattern formation accuracy was approximately 100 nmp-p(1/1000) in the case of the exposure apparatus 100 depicted in FIG. 5, whereas the pattern formation accuracy was approximately 10 nm to 30 nmp-p in the case of the exposure apparatuses 10 and 10a according to the first and second embodiments. Thus, the exposure apparatuses 10 and 10a of this disclosure improved the pattern formation accuracy by approximately 3 times to 10 times compared with the apparatuses which do not use integrated surface profile data.

The above embodiments describe examples where the master 1 has a cylindrical shape; however, this disclosure is not limited to this shape, and the master 1 may be shaped like a disk. Alternatively, the master 1 may be shaped for example like a rectangular plate. When the master 1 is shaped like a rectangular plate, the master 1 is set so that the surface of the master 1 to be exposed faces the optical pickup 12, and the optical pickup 12 is moved along the surface of the master 1 to be exposed. In this case, for the integrated surface profile data, the relative positional relationship between the surface of the master 1 and the optical pickup 12 according to at least one of the roughness of the surface of the master 1 and the inclination of the master 1 is measured.

Further, the embodiments described above use a method in which the active area of the optical sensor 13 is divided into four areas, and a focus error is detected based on voltages $V_A$ to $V_D$ corresponding to light applied to the areas A to D. This method is referred to as an astigmatic method. Alternatively, for the detection of a focus error, for example, a knife edge focusing technique may be used in which a focus error is detected by detecting the displacement of the light spot image on the plane receiving a beam of light reflected by the master 1 when the object lens 124 is moved forward and backward in the direction of travel of the light beam.

It should be noted that while the present invention has been described in conjunction with the drawings and the embodiments, those skilled in the art can easily implement various changes and modifications based on this disclosure. It should therefore be noted that the changes or modifications are included in the scope of the present invention. Functions included in blocks can be rearranged in a manner no logical inconsistency arises; for example, a plurality of blocks may be combined into one or may be divided.

REFERENCE SIGNS LIST

10, 10a, 100: Exposure apparatus
11: Spindle motor
12: Optical pickup
121: Laser light source
122: Collimator lens
123: Polarizing beam splitter
124: Object lens
125: Actuator
126: Cylindrical lens
13: Optical sensor 14, 14a: Error computing unit
15, 150: Subtracteriii
16: Control computing unit
17: Amplification unit
18, 18a: Adder
19, 19a: Control unit
21: Computing unit

The invention claimed is:

1. An exposure apparatus for forming a pattern by exposure by irradiating a set master with laser light, comprising:
   a light source unit emitting the laser light and capable of adjusting a focus of the laser light; and
   a control unit adjusting a focus of laser light emitted from the light source unit using integrated surface profile data indicating a relative positional relationship between a surface of the master and the light source unit depending on at least one of surface roughness of the master, inclination of the master, and decentering of the master, wherein
   the control unit comprises:
   an error detection unit performing output corresponding to a focus error of the laser light;
   an adder adding a target value corresponding to an output from the error detection unit with the laser light focusing on the surface of the master and an offset value based on a correction signal generated based on the integrated surface profile data; and
   a control computing unit adjusting a focus of the laser light based on a difference between a sum obtained by the adder and the output from the error detection unit.

2. The exposure apparatus according to claim 1, wherein the correction signal is one of a table and a function corresponding to the position of the surface of the master.

3. An exposure apparatus for forming a pattern by exposure by irradiating a set master with laser light, comprising:
   a light source unit emitting the laser light and capable of adjusting a focus of the laser light; and
   a control unit adjusting a focus of laser light emitted from the light source unit using integrated surface profile data indicating a relative positional relationship between a surface of the master and the light source unit depending on at least one of surface roughness of the master, inclination of the master, and decentering of the master, wherein
   the control unit comprises:
   an error detection unit performing output corresponding to a focus error of the laser light;
   a computing unit calculating an offset value for correcting a target value corresponding to an output from the error detection unit with the laser light focusing on the surface of the master by performing predetermined computations on the output from the error detection unit based on the integrated surface profile data;
   an adder adding the target value and the offset value calculated by the computing unit; and
   a control computing unit adjusting a focus of the laser light based on a difference between a sum obtained by the adder and the output from the error detection unit.

4. The exposure apparatus according to claim 1, wherein the light source unit is an optical pickup, and
   the integrated surface profile data are measured by the optical pickup.

5. The exposure apparatus according to claim 4, wherein the optical pickup includes an optical sensor outputting a voltage corresponding to a focus error of the laser light, and the integrated surface profile data are measured based on the output from the optical sensor.

6. The exposure apparatus according to claim 4, wherein the optical pickup comprises:
   an object lens directing the laser light to the master; and
   an actuator displacing the object lens, and
   wherein the integrated surface profile data are measured based on a current flowing in the actuator.

7. The exposure apparatus according to claim 1, wherein the integrated surface profile data are measured by a displacement meter.

8. The exposure apparatus according to claim 1, wherein the master is one of a cylindrical master and a columnar master.

9. The exposure apparatus according to claim 1, wherein the master is a plate-like master.

10. An exposure method using an exposure apparatus which includes a light source emitting laser light and is capable of adjusting a focus of the laser light, and emits the laser light to a set master, the method comprising:
    adjusting a focus of laser light emitted from the light source unit using integrated surface profile data indicating a relative positional relationship between a surface of the master and the light source unit depending on at least one of surface roughness of the master, inclination of the master, and decentering of the master, wherein adjusting the focus of laser light emitted from the light source unit further comprises:
    performing, by an error detection unit, output corresponding to a focus error or the laser light;
    adding, by an adder, a target value corresponding to an output from the error detection unit with the laser light focusing on the surface of the master and an offset value based on a correction signal generated based on the integrated surface profile data;
    adjusting a focus of the laser light based on a difference between a sum obtained by the adder and the output from the error detection unit.

11. An exposure method using an exposure apparatus which includes a light source emitting laser light and is capable of adjusting a focus of the laser light, and emits the laser light to a set master, the method comprising:
    adjusting a focus of laser light emitted from the light source unit using integrated surface profile data indicating a relative positional relationship between a surface of the master and the light source unit depending on at least one of surface roughness of the master, inclination of the master, and decentering of the master, wherein adjusting the focus of laser light emitted from the light source unit further comprises:
    performing, by an error detection unit, output corresponding to a focus error of the laser light;
    calculating, by a computing unit, an offset value for correcting a target value corresponding to an output from the error detection unit with the laser light focusing on the surface of the master by performing predetermined computations on the output from the error detection unit based on the integrated surface profile data;
    adding, by an adder, the target value and the offset value calculated by the computing unit; and
    adjusting a focus of the laser light based on a difference between a sum obtained by the adder and the output from the error detection unit.

12. The exposure apparatus according to claim 3, wherein the light source unit is an optical pickup, and the integrated surface profile data are measured by the optical pickup.

13. The exposure apparatus according to claim 12, wherein the optical pickup includes an optical sensor outputting a voltage corresponding to a focus error of the laser light, and the integrated surface profile data are measured based on the output from the optical sensor.

14. The exposure apparatus according to claim 12, wherein the optical pickup comprises:

an object lens directing the laser light to the master; and an actuator displacing the object lens, and wherein the integrated surface profile data are measured based on a current flowing in the actuator.

15. The exposure apparatus according to claim 3, wherein the integrated surface profile data are measured by a displacement meter.

16. The exposure apparatus according to claim 3, wherein the master is one of a cylindrical master and a columnar master.

17. The exposure apparatus according to claim 3, wherein the master is a plate-like master.

* * * * *